United States Patent
Taniguchi et al.

(10) Patent No.: US 9,379,101 B2
(45) Date of Patent: Jun. 28, 2016

(54) SEMICONDUCTOR INTEGRATED CIRCUIT DEVICE

(71) Applicant: SOCIONEXT INC., Kanagawa (JP)

(72) Inventors: Koichi Taniguchi, Kyoto (JP); Masato Maede, Kyoto (JP)

(73) Assignee: SOCIONEXT INC, Kanagawa (JP)

( * ) Notice: Subject to any disclaimer, the term of this patent is extended or adjusted under 35 U.S.C. 154(b) by 0 days.

(21) Appl. No.: 14/684,323

(22) Filed: Apr. 10, 2015

(65) Prior Publication Data

US 2015/0214215 A1    Jul. 30, 2015

Related U.S. Application Data

(60) Continuation of application No. 14/276,940, filed on May 13, 2014, now Pat. No. 9,029,917, which is a continuation of application No. 12/786,090, filed on May 24, 2010, now Pat. No. 8,759,883, which is a division of application No. 11/966,529, filed on Dec. 28, 2007, now Pat. No. 7,750,373.

(30) Foreign Application Priority Data

Dec. 28, 2006 (JP) .................................. 2006-354397

(51) Int. Cl.
| H01L 27/02 | (2006.01) |
| H01L 23/544 | (2006.01) |
| H01L 27/092 | (2006.01) |

(52) U.S. Cl.
CPC .......... *H01L 27/0292* (2013.01); *H01L 23/544* (2013.01); *H01L 27/0207* (2013.01); *H01L 27/0928* (2013.01); *H01L 2924/0002* (2013.01)

(58) Field of Classification Search
USPC ....................................................... 257/203
See application file for complete search history.

(56) References Cited

U.S. PATENT DOCUMENTS

| 4,945,395 A | 7/1990 | Suehiro |
| 5,844,281 A | 12/1998 | Narita |

(Continued)

FOREIGN PATENT DOCUMENTS

| JP | 2004-164620 A | 6/2004 |
| JP | 2004-296998 A | 10/2004 |

OTHER PUBLICATIONS

Non-Final Office Action issued in U.S. Appl. No. 12/786,090 dated Nov. 9, 2011.

(Continued)

*Primary Examiner* — Zandra Smith
*Assistant Examiner* — Lawrence Tynes, Jr.
(74) *Attorney, Agent, or Firm* — McDermott Will & Emery LLP

(57) ABSTRACT

In a semiconductor integrated circuit device, a plurality of electrode pads for external connection are arranged in a zig-zag pattern. Some electrode pads of the electrode pads of the plurality of I/O cells which are closer to a side of the semiconductor chip, each have an end portion closer to the side of the semiconductor chip, the end portion being set at the same position as that of an end portion of the corresponding I/O cell. A power source-side protective circuit and a ground-side protective circuit against discharge of static electricity are provided with the power source-side protective circuit being closer to the scribe region. A distance between a center position of one of the electrode pads and the ground-side protective circuit of the corresponding I/O cell and a distance between a center position of the other one electrode pad and the ground-side protective circuit of the corresponding I/O cell are both short and are substantially equal between each I/O cell.

16 Claims, 18 Drawing Sheets

(56) References Cited

U.S. PATENT DOCUMENTS

| | | |
|---|---|---|
| 6,856,022 B2 | 2/2005 | Nojiri et al. |
| 6,992,356 B2 | 1/2006 | Taniguchi et al. |
| 7,750,373 B2 * | 7/2010 | Taniguchi ........... H01L 27/0207 257/203 |
| 2004/0075157 A1 | 4/2004 | Konishi et al. |
| 2004/0188848 A1 | 9/2004 | Nojiri et al. |
| 2006/0082940 A1 | 4/2006 | Lin |
| 2006/0180864 A1 | 8/2006 | Suzuki et al. |

OTHER PUBLICATIONS

Notice of Allowance issued in U.S. Appl. No. 12/786,090 dated Feb. 14, 2014.

United States Office Action issued in U.S. Appl. No. 11/966,529 dated Aug. 19, 2009.

United States Notice of Allowance issued in U.S. Appl. No. 11/966,529 dated Mar. 29, 2010.

United States Notice of Allowance issued in U.S. Appl. No. 14/276,940 dated Jan. 12, 2015.

* cited by examiner

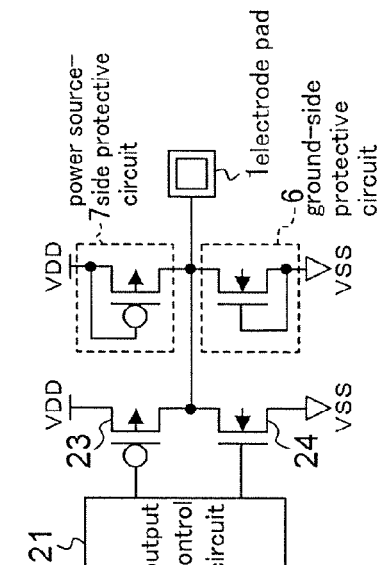
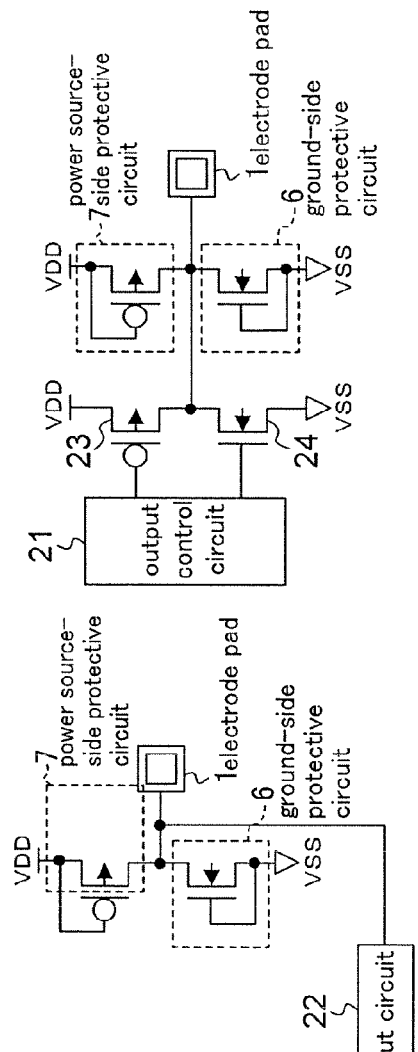
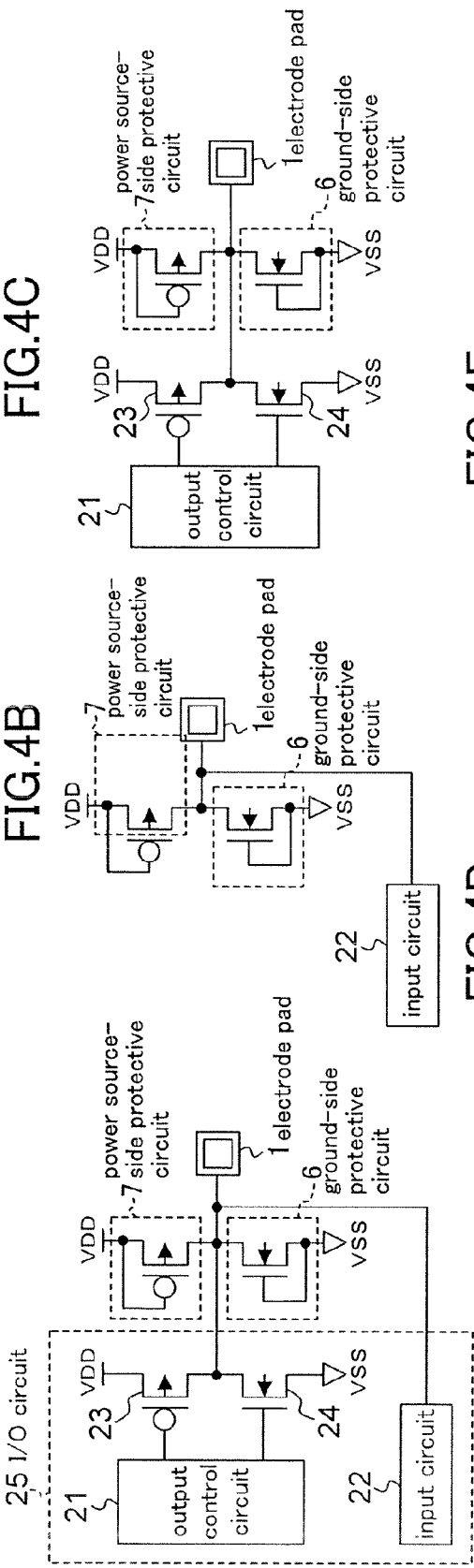
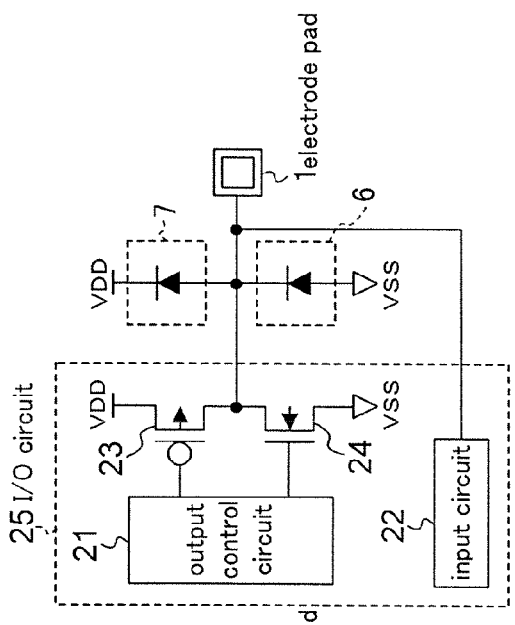
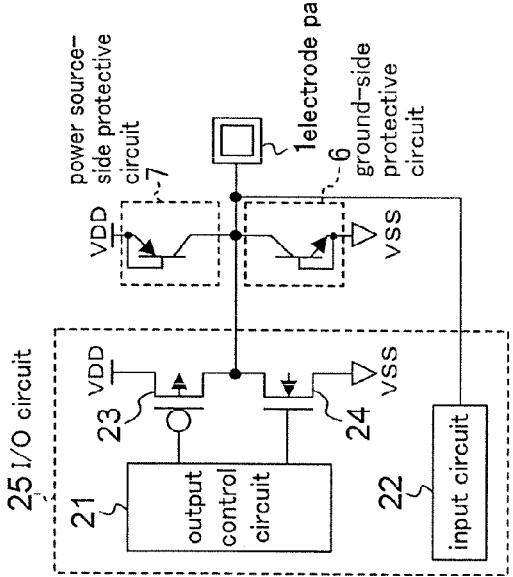

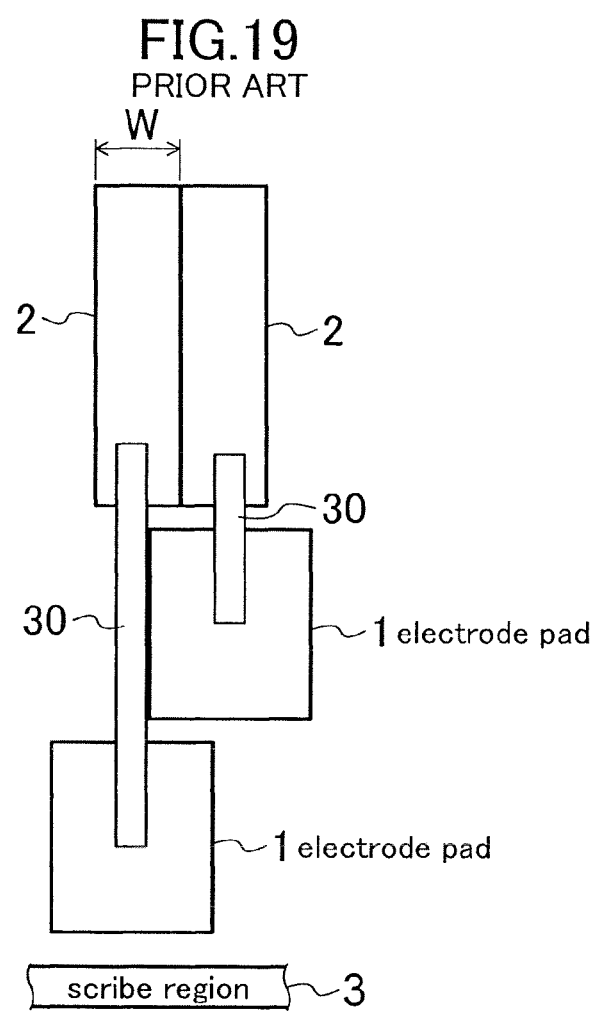

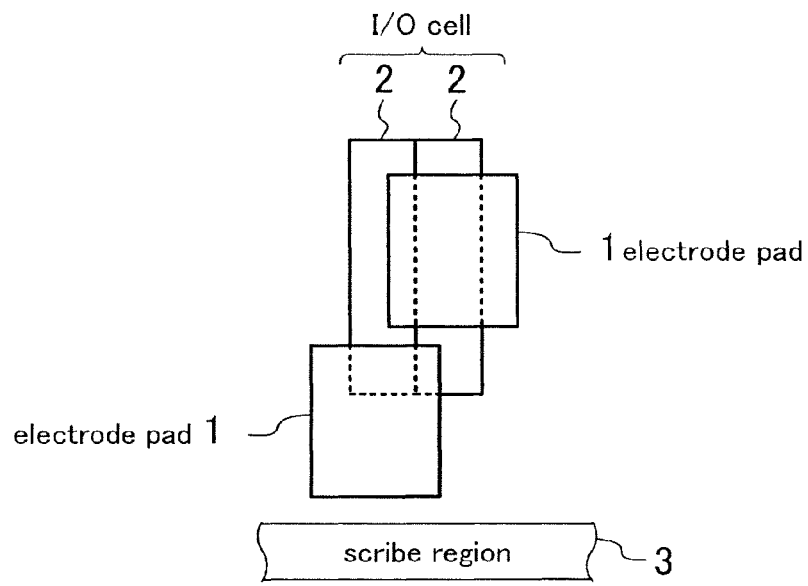
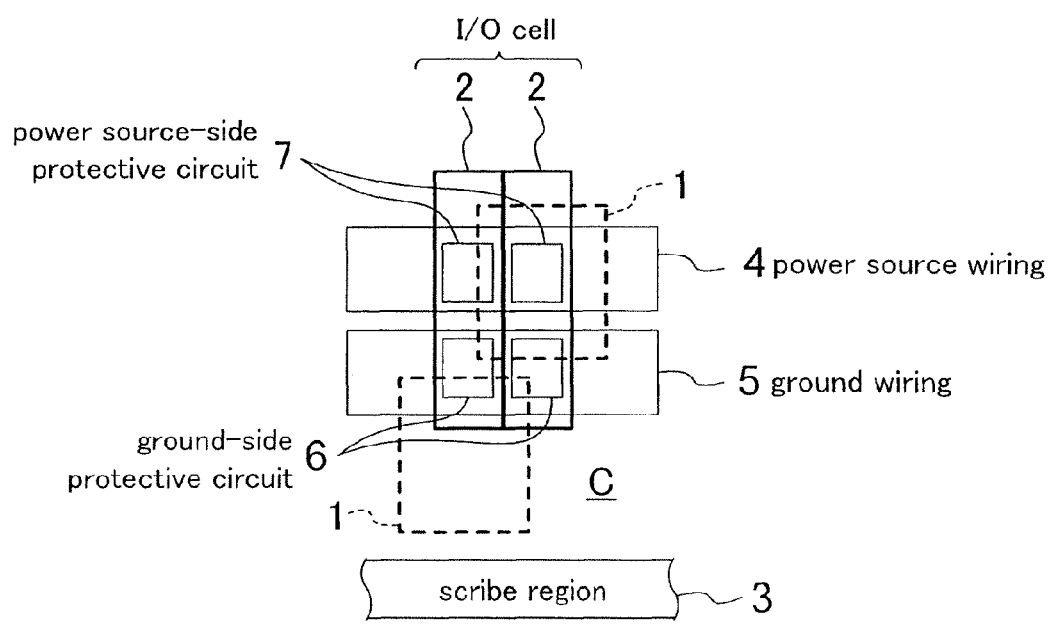

SEMICONDUCTOR INTEGRATED CIRCUIT DEVICE

CROSS REFERENCE TO RELATED APPLICATIONS

This application is a Continuation of application Ser. No. 14/276,940, filed May 13, 2014, which is a Continuation of U.S. application Ser. No. 12/786,090, filed May 24, 2010, now U.S. Pat. No. 8,759,883, which is a Divisional of U.S. application Ser. No. 11/966,529, filed Dec. 28, 2007, now U.S. Pat. No. 7,750,373, claiming priority of Japanese Patent Application No. 2006-354397, filed on Dec. 28, 2006, the entire contents of each of which are hereby incorporated by reference.

BACKGROUND OF THE INVENTION

1. Field of the Invention

The present invention relates to a semiconductor integrated circuit device comprising a protective circuit for protecting a semiconductor chip from externally intruding static electricity.

2. Description of the Related Art

FIG. 18 shows a wafer 65 during manufacture of a semiconductor chip and a plurality of semiconductor chips 66 provided on the wafer 65. A peripheral region of the semiconductor chip 66 is a so-called scribe region 3 which is used to separate the semiconductor chips 66 on the wafer 65. After the wafer is separated into the individual semiconductor chips 66, the scribe region 3 is cut away by dicing. At the four sides along the scribe region 3 of the semiconductor chip 66, a plurality of signal input cells, signal output cells, or signal input/output cells 2 for giving and receiving a signal to and from the outside are provided (hereinafter, input cells, output cells, or input/output cells are collectively referred to as "I/O cells"). Each I/O cell 2 has an electrode pad (not shown in FIG. 18), and gives and receives a signal to and from an external circuit via the electrode pad.

In recent years, as the number of signals is increased in order to extend functions, the number of required electrode pads is also increased. Therefore, the size of the semiconductor chip 66 is often determined by the number of electrode pads.

To reduce the size of the semiconductor chip 66, for example, Japanese Unexamined Patent Application Publication No. 2000-164620 discloses an arrangement in which, as shown in FIG. 19, each I/O cell 2 is caused to have a small cell width W and the electrode pads 1 for external connection of the I/O cells 2 are vertically provided in a zigzag pattern between the scribe region 3 and the I/O cell 2. Note that, in FIG. 19, 30 indicates wirings for connecting the electrode pads 1 and the I/O cells 2.

Conventionally, further, to reduce the size of the semiconductor chip 66, for example, Japanese Unexamined Patent Application Publication No. 2004-296998 discloses that, as shown in FIG. 20, an electrode pad 1 for external connection is provided above an I/O cell 2 so that the area of a space between an I/O cell 2 and a scribe region 3 is reduced.

In a semiconductor chip, a protective circuit for protecting the semiconductor chip from externally intruding static electricity is provided in each I/O cell 2. In the semiconductor chip having the protective circuit, as shown in FIG. 21, static electricity intruding from the outside of the semiconductor chip is caused to escape from the electrode pad 1 for external connection via a ground-side protective circuit 6 in the corresponding I/O cell 2 to a ground wiring 5, or from the electrode pad 1 via a power source-side protective circuit 7 in the corresponding I/O cell 2 to a power source wiring 4. The potential of the ground wiring 5 is often caused to be the same as the potential of the substrate of the semiconductor chip 66.

The present inventors found that, in the I/O cell 2 having the protective circuits 6 and 7, resistance against static electricity can be enhanced basically by reducing a distance between the electrode pad 1 and the ground-side protective circuit 6 of the corresponding I/O cell 2 to lower a resistance value therebetween. Therefore, in the arrangement disclosed in Japanese Unexamined Patent Application Publication No. 2004-296998, the distance between the electrode pad 1 and the ground-side protective circuit 6 of the corresponding I/O cell 2 is short, and the distance does not vary much among the I/O cells 2, so that the resistance against static electricity of each I/O cell 2 is enhanced.

However, it was found that, in the conventional semiconductor integrated circuit devices of FIGS. 20 and 21, although a portion of the electrode pad 1 for external connection closer to the scribe region 3 is positioned above the I/O cell 2, a useless empty space C is present below a portion thereof closer to the scribe region 3, and as a result, the reduction of the size of the semiconductor chip 66 is hindered. Specifically, since circuits, such as an internal logic circuit and the like, other than the I/O cells 2 of the semiconductor chip 66 are present in inner portions of the semiconductor chip (closer to the center of the chip, i.e., a side opposite to the scribe region 3 of the I/O cell 2), the empty space C present between the scribe region 3 and the I/O cell 2 is difficult to use and is useless.

SUMMARY OF THE INVENTION

An object of the present invention is to solve the above-described problems with conventional semiconductor integrated circuit devices and provide a semiconductor integrated circuit device having a small size.

To achieve the object, in the present invention, relative positions of the electrode pad 1 for external connection and the I/O cell 2 is changed as required.

According to the present invention, a semiconductor integrated circuit device is provide in which a plurality of I/O cells are provided in parallel with a periphery of a semiconductor chip, and said each I/O cell has only a data input function, only a data output function, or both data input and output functions and includes a protective circuit for protecting an internal circuit from discharge of static electricity. In the semiconductor integrated circuit device, each of the plurality of I/O cells has a corresponding electrode pad positioned above the I/O cell and connected to the protective circuit. The electrode pads for the plurality of I/O cells are arranged in a zigzag pattern. Some electrode pads of the electrode pads of the plurality of I/O cells which are closer to a side of the semiconductor chip, each have an end portion closer to the side of the semiconductor chip, the end portion being set at the same position as that of an end portion of the corresponding I/O cell.

According to the present invention, a semiconductor integrated circuit device is provided in which a plurality of I/O cells are provided in parallel with a periphery of a semiconductor chip, and each I/O cell has only a data input function, only a data output function, or both data input and output functions and includes a protective circuit for protecting an internal circuit from discharge of static electricity. Each of the plurality of I/O cells is connected to the corresponding protective circuit and has an electrode pad positioned above the I/O cell. The electrode pads for the plurality of I/O cells are arranged in a zigzag pattern. Some electrode pads of the electrode pads of the plurality of I/O cells which are closer to a side of the semiconductor chip, each have an end portion closer to the side of the semiconductor chip, the end portion being set at the same position as that of an end portion of the corresponding I/O cell. Each of the protective circuits of the plurality of I/O cells includes a power source-side protective circuit provided between the corresponding electrode pad and a power source wiring and a ground-side protective circuit provided between the corresponding electrode pad and a ground wiring. The power source-side protective circuit is positioned closer to the side of the semiconductor chip, while the ground-side protective circuit is positioned farther inside the semiconductor chip.

In an example of the semiconductor integrated circuit device of the present invention, the power source wiring is positioned closer to the side of the semiconductor chip, while the ground wiring is positioned farther inside the semiconductor chip.

In an example of the semiconductor integrated circuit device of the present invention, the power source wiring is positioned above the power source-side protective circuit, while the ground wiring is positioned above the ground-side protective circuit.

In an example of the semiconductor integrated circuit device of the present invention, a distance between a center position of the ground-side protective circuit and a center position of the electrode pad connected to the ground-side protective circuit is the same between adjacent two of the I/O cells.

In an example of the semiconductor integrated circuit device of the present invention, the power source-side protective circuit and the ground-side protective circuit each include a MOS transistor.

In an example of the semiconductor integrated circuit device of the present invention, the power source-side protective circuit and the ground-side protective circuit each include a bipolar transistor.

In an example of the semiconductor integrated circuit device of the present invention, the power source-side protective circuit and the ground-side protective circuit each include a diode.

In an example of the semiconductor integrated circuit device of the present invention, two rows of electrode pads are provided above the plurality of I/O cells and are arranged in a direction from the side of the semiconductor chip toward the farther inside of the semiconductor chip in a zigzag pattern. One or more rows of electrode pads are provided in the direction toward the farther inside of the semiconductor chip. The three or more rows of electrode pads are arranged in a zigzag pattern as a whole.

In an example of the semiconductor integrated circuit device of the present invention, the I/O cell including the protective circuit is provided in a triple-well region. A guard ring diffusion layer for fixing a potential of a deep well closer to the side of the semiconductor chip also serves as a guard ring diffusion layer for the power source-side protective circuit.

In an example of the semiconductor integrated circuit device of the present invention, portions adjacent to each other of the guard ring diffusion layer for the ground-side protective circuit and a guard ring diffusion layer for a predetermined circuit provided in the corresponding I/O cell share a common portion.

In an example of the semiconductor integrated circuit device of the present invention, portions adjacent to each other of guard ring diffusion layers for two adjacent predetermined circuits provided in each I/O cell share a common portion.

In an example of the semiconductor integrated circuit device of the present invention, the portions adjacent to each other of the guard ring diffusion layers for the two adjacent predetermined circuits are removed.

According to the present invention, a semiconductor integrated circuit device is provided in which a plurality of I/O cells are provided in parallel with a periphery of a semiconductor chip, and each I/O cell has only a data input function, only a data output function, or both data input and output functions and includes a protective circuit for protecting an internal circuit from discharge of static electricity. Each of the plurality of I/O cells has a corresponding electrode pad connected to the I/O cell, and the electrode pads of the plurality of I/O cells are arranged in a zigzag pattern. Any particular one of the plurality of electrode pads has a portion positioned above the corresponding I/O cell and a remaining portion positioned farther inside the semiconductor chip than the corresponding I/O cell. A wiring, or a circuit element different from the I/O cell is provided in a region farther inside the semiconductor chip than the corresponding I/O cell in a region below the particular electrode pad.

In an example of the semiconductor integrated circuit device of the present invention, a power source wiring or a ground wiring is provided in the portion positioned farther inside the semiconductor chip than the corresponding I/O cell in the region below the particular electrode pad.

In an example of the semiconductor integrated circuit device of the present invention, some electrode pads of the electrode pads of the plurality of I/O cells which are closer to a side of the semiconductor chip, each have an end portion closer to the side of the semiconductor chip, the end portion being set at the same position as that of an end portion of the corresponding I/O cell.

In an example of the semiconductor integrated circuit device of the present invention, the electrode pads of the plurality of I/O cells are arranged in two or more rows which are arranged in a direction from a side of the semiconductor chip toward the farther inside of the semiconductor chip. The particular electrode pads are those in the second or more row of electrode pads from the side of the semiconductor chip.

In an example of the semiconductor integrated circuit device of the present invention, the protective circuits of the plurality of I/O cells each include a power source-side protective circuit and a ground-side protective circuit. A power source wiring connected to the power source-side protective circuit and a ground wiring connected to the ground-side protective circuit are provided in a region below the plurality of I/O cells. A first power source wiring connected to the power source wiring, a first ground wiring connected to the ground wiring, or a second power source wiring or a second ground wiring different from the first power source wiring or the first ground wiring is provided in a portion positioned farther inside the semiconductor chip than the corresponding I/O cell in a region below the particular electrode pad.

In an example of the semiconductor integrated circuit device of the present invention, any two kinds of wirings of the first power source wiring, the first ground wiring, the second power source wiring, and the second ground wiring are alternately arranged. Of the two kinds of wirings, one kind of wirings are arranged in parallel with each other, while the other kind of wirings perpendicular to the parallel wirings are arranged in a wiring layer other than a wiring layer in which the parallel wirings are provided, and the same potentials are connected through a via, so that the parallel wirings and the perpendicular wirings are arranged in a mesh-like power source structure.

In an example of the semiconductor integrated circuit device of the present invention, the circuit element different from the I/O cell which is provided in the region farther inside the semiconductor chip than the corresponding I/O cell in the region below the particular electrode pad is a logic circuit element or a memory circuit element for providing a function required in the semiconductor chip.

In an example of the semiconductor integrated circuit device of the present invention, the circuit element different from the I/O cell which is provided in the region farther inside the semiconductor chip than the corresponding I/O cell in the region below the particular electrode pad is a protective circuit provided between two kinds of wirings of the first power source wiring, the first ground wiring, the second power source wiring, and the second ground wiring and for protecting an internal circuit from discharge of static electricity.

In an example of the semiconductor integrated circuit device of the present invention, the circuit element different from the I/O cell which is provided in the region farther inside the semiconductor chip than the corresponding I/O cell in the region below the particular electrode pad is an electric charge preventing diode provided between a signal wiring and a semiconductor substrate used in the semiconductor chip.

In an example of the semiconductor integrated circuit device of the present invention, the circuit element different from the I/O cell which is provided in the region farther inside the semiconductor chip than the corresponding I/O cell in the region below the particular electrode pad is an inter-power source capacitor between two kinds of wirings of the first power source wiring, the first ground wiring, the second power source wiring, and the second ground wiring.

Thus, in the present invention, a plurality of rows of electrode pads are arranged in a zigzag pattern above a plurality of I/O cells. In this configuration, an end portion closer to a side of a semiconductor chip (i.e., closer to a scribe region) of an electrode pad closer to the side of the semiconductor chip is provided at the same position as that of an end portion closer the side of the semiconductor chip of an I/O cell. Therefore, it is possible to eliminate a useless region between the I/O cell and the scribe region, resulting in a reduction in size of the semiconductor chip.

In addition, all of the plurality of electrode pads arranged in a zigzag pattern are positioned inside the semiconductor chip above the I/O cells. The ground-side protective circuit is provided farther inside the semiconductor chip than the power source-side protective circuit, so that a distance between a center position of each of the electrode pads arranged in a zigzag pattern as a whole and a center position of the ground-side protective circuit connected to the electrode pads can be short and substantially equal between each I/O cell. Therefore, the ability to discharge static electricity can be enhanced.

Also, in the present invention, when the I/O cell is provided in a triple-well region, a well potential fixing diffusion region (a so-called guard ring diffusion region) of the power source-side protective circuit also suppresses the potential of a deep well, so that a guard ring diffusion region for a deep well can be removed. Therefore, the size of the semiconductor chip can be reduced by an amount corresponding to the region.

Further, in the present invention, in a particular electrode pad having a portion positioned above the corresponding I/O cell of a plurality of rows of electrode pads arranged in a zigzag pattern, the remaining portion is positioned farther inside the semiconductor chip than the corresponding I/O cell. A wiring, or a circuit element different from the I/O cell is provided in a region below the remaining portion. Conventionally, the wiring, or the circuit element different from the I/O cell is provided in a chip inside region farther inside the semiconductor chip than the I/O cell and the electrode pad. Therefore, in the present invention, the size of the semiconductor chip can be reduced by an amount corresponding to the wiring, or the circuit element different from the I/O cell.

BRIEF DESCRIPTION OF THE DRAWINGS

FIGS. 4A to 4E are diagrams showing electrical circuits of the I/O circuit, the power source-side protective circuit, and the ground-side protective circuit included in the semiconductor integrated circuit device of FIGS. 2 and 3. FIG. 4A is a diagram when the I/O circuit has input and output functions. FIG. 4B is a diagram when the I/O circuit has only an input function. FIG. 4C is a diagram when the I/O circuit has only an output function. FIG. 4D is a diagram showing another exemplary internal configuration of the power source-side protective circuit and the ground-side protective circuit. FIG. 4E is a diagram showing still another exemplary internal configuration of the power source-side protective circuit and the ground-side protective circuit.

FIG. 19 is a diagram showing a conventional positional relationship between I/O cells, electrode pads for external connection, and a scribe region.

FIG. 20 is a plane view showing a conventional modified positional relationship between I/O cells, electrode pads, and a scribe region.

FIG. 21 is a plan view of FIG. 20 in which a power source wiring, a ground wiring, a power source-side protective circuit, and a ground-side protective circuit are further provided.

DETAILED DESCRIPTION OF THE PREFERRED EMBODIMENTS

Hereinafter, preferred examples of the present invention will be described with reference to the accompanying drawings.

(First Example)

Figure 1:
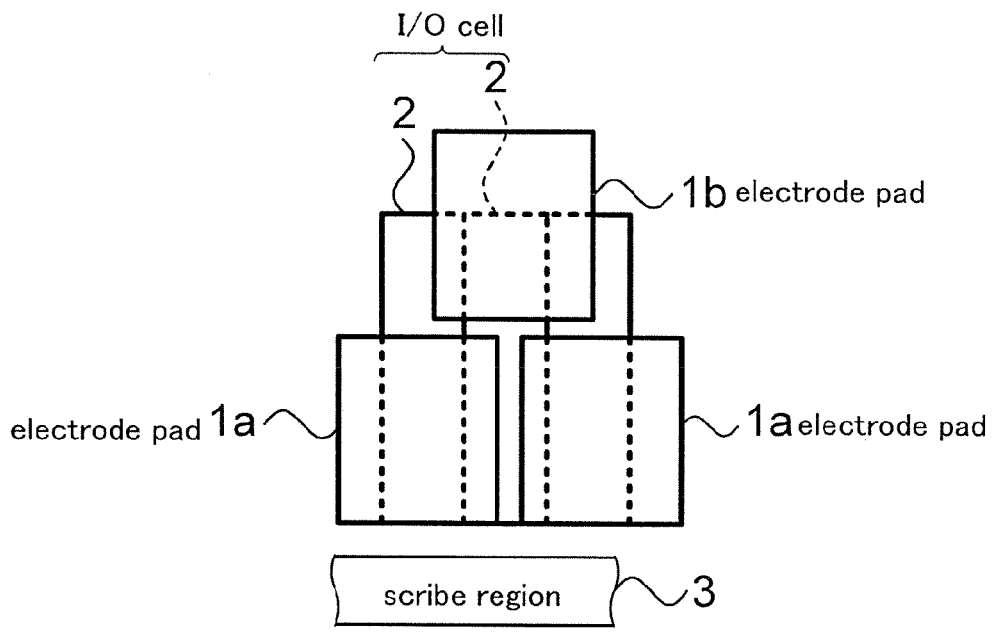
FIG. 1 is a plan view showing a positional relationship between I/O cells, electrode pads for external connection, and a scribe region in a semiconductor integrated circuit device according to a first example of the present invention.

FIG. 1 is a diagram an arrangement of a semiconductor integrated circuit device according to a first example of the present invention.

FIG. 1 shows a positional relationship between electrode pads 1 for external connection and I/O cells 2 connected to the electrode pads. In FIG. 1, the electrode pads 1a and 1b are arranged in a zigzag pattern as viewed from a scribe region 3. The electrode pads are arranged in two rows which are arranged from the scribe region 3 at a side of the semiconductor chip toward the farther inside of the semiconductor chip. An end portion closer to the scribe region 3 of the electrode pad 1a closer to the scribe region 3 is set at substantially the same position as that of an end portion closer to the scribe region 3 of the I/O cell 2.

Thus, of the electrode pads 1a and 1b arranged in a zigzag pattern, the end portion closer the scribe region 3 of the electrode pad 1a closer to the scribe region 3 is set at substantially the same position as that of the end portion closer to the scribe region 3 of the I/O cell 2. Therefore, as compared to the conventional examples of FIGS. 20 and 21, an empty space C between the I/O cell 2 and the scribe region 3 can be limited to a considerably narrow region, thereby making it possible to reduce the size of the semiconductor chip.

Figure 2:
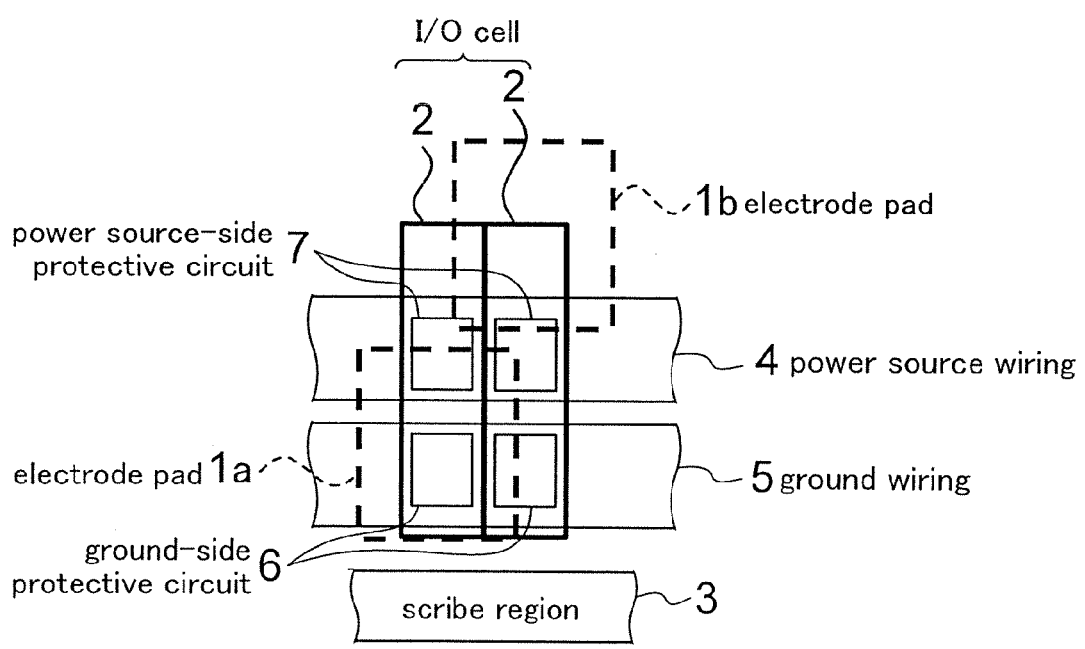
FIG. 2 is a plan view showing the semiconductor integrated circuit device of FIG. 1 in which a power source wiring, a ground wiring, a power source-side protective circuit, and a ground-side protective circuit are further provided.

FIG. 2 shows, in addition to the arrangement of FIG. 1, a ground-side protective circuit 6 and a power source-side protective circuit 7 which are provided for each I/O cell 2 and are connected to the corresponding electrode pads 1a and 1b. In FIG. 2, the ground-side protective circuit 6 is provided at an end portion closer to the scribe region 3 of the I/O cell 2, and a ground wiring 5 which is connected to the ground-side protective circuit 6 is provided above the ground-side protective circuit 6, extending in a horizontal direction of FIG. 2. The power source-side protective circuit 7 is provided above the ground-side protective circuit 6 in FIG. 2, i.e., farther inside the semiconductor chip. A power source wiring 4 which is connected to the power source-side protective circuit 7 is provided above the power source-side protective circuit 7, extending in a horizontal direction of FIG. 2

Figure 3:
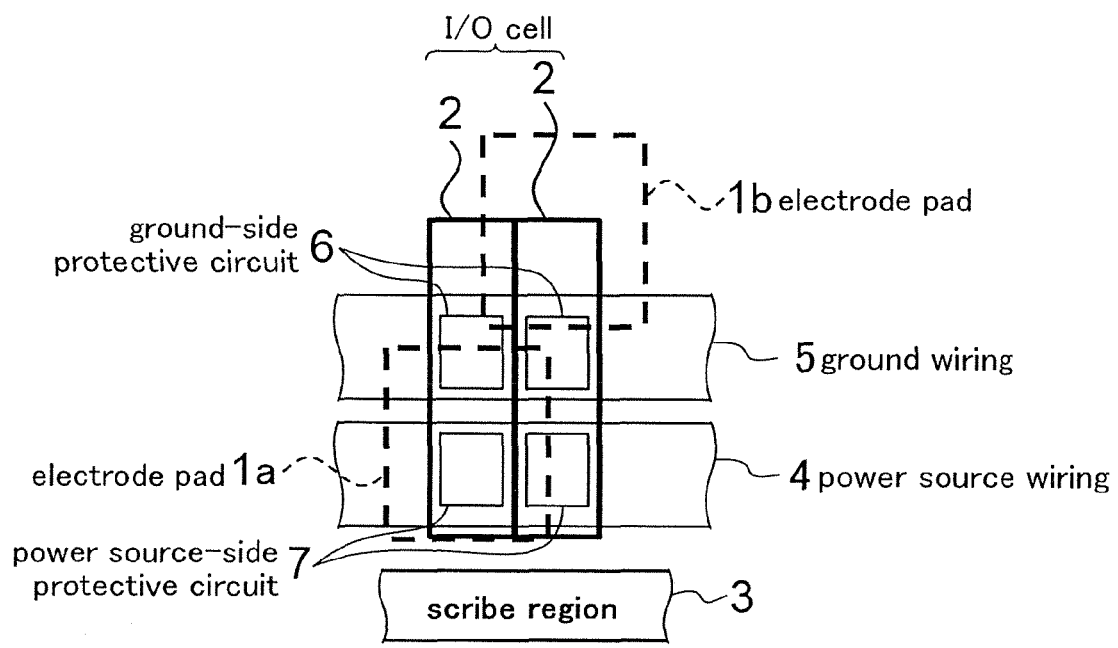
FIG. 3 is a plan view showing a variation of the semiconductor integrated circuit device of FIG. 2.

FIG. 3 shows an arrangement in which the positions of the power source wiring 4 and the ground wiring 5 of the arrangement of FIG. 2 are reversed as viewed from the scribe region 3. Accordingly, the positions of the power source-side protective circuit 7 provided in the I/O cell 2 between the electrode pads 1a and 1b and the power source wiring 4, and the ground-side protective circuit 6 provided in the I/O cell 2 between the electrode pads 1a and 1b and the ground wiring 5 are also reversed. In other words, in FIG. 3, the power source-side protective circuit 7 is provided at an end portion closer to the scribe region 3 of the I/O cell 2, and the power source wiring 4 connected to the power source-side protective circuit 7 is provided above the power source-side protective circuit 7, extending in a horizontal direction of FIG. 3. Also, the ground-side protective circuit 6 is provided above the power source-side protective circuit 7 in FIG. 3, i.e., farther inside the semiconductor chip. The ground wiring 5 connected to the ground-side protective circuit 6 is provided above the ground-side protective circuit 6, extending in a horizontal direction of FIG. 3.

In the I/O cell 2 having the protective circuits 6 and 7, static electricity intruding and applied from the electrode pad 1a or 1b is caused to escape to the power source wiring 4 via the power source-side protective circuit 7 connected to the electrode pad 1a or 1b. Similarly, static electricity intruding and applied from the electrode pad 1a or 1b is caused to escape to the ground wiring 5 via the ground-side protective circuit 6 connected to the electrode pad 1a or 1b.

In the arrangement of FIG. 3, an end portion closer to the scribe region 3 of the electrode pad 1a closer to the scribe region 3 is provided at substantially the same position as that of an end portion of the I/O cell 2. Therefore, a portion of the electrode pad 1b farther from the scribe region 3 is provided above the I/O cell 2, while the remaining portion thereof is provided farther inside the semiconductor chip than the I/O cell 2. However, since the ground-side protective circuit 6 is provided farther inside the semiconductor chip than the power source-side protective circuit 7, distances between center positions of the electrode pads 1a and 1b and center positions of the ground-side protective circuits 6 and 6 can be caused to be short and substantially the same between each I/O cell 2, so that the resistance values of connection wirings which connect the electrode pads 1a and 1b and the ground-side protective circuits 6 and 6 can be effectively reduced. Therefore, the protection function of the ground-side protective circuit 6 can be enhanced, thereby making it possible to improve resistance against static electricity, while an empty space between the I/O cell 2 and the scribe region 3 can be limited to a small region.

FIGS. 4A to 4E are electrical circuit diagrams of internal arrangements of the I/O cell 2. The I/O cell 2 of FIG. 4A comprises an I/O circuit 25 having an output control circuit 21, an input circuit 22, an H-level output transistor 23, and an L-level output transistor 24, a power source-side protective circuit 7 including a P-channel MOS transistor, and a ground-side protective circuit 6 including an N-channel MOS transistor. When an H-level output signal is output to an electrode pad 1, the output control circuit 21 causes both the gate portions of the H-level output transistor 23 and the L-level output transistor 24 to go to an L level. On the other hand, when an L-level output signal is output to the electrode pad 1, both the gate portions are caused to go to an H level. When a signal of the electrode pad 1 is transferred to the inside of the semiconductor chip, the signal is transmitted via the input circuit 22. Both the power source-side protective circuit 7 and the ground-side protective circuit 6 are connected to the electrode pad 1. Note that the above-described internal circuit arrangement of the I/O circuit 25 is only for illustrative purposes and the present invention is not limited to this. The gate terminal of the MOS transistor included in the power source-side protective circuit 7 is directly connected to a power source VDD, and the gate terminal of the MOS transistor included in the ground-side protective circuit 6 is directly connected to a ground VSS. The gate terminal of the MOS transistor included in the power source-side protective circuit 7 and the gate terminal of the MOS transistor included in the ground-side protective circuit 6 may be connected to the power source VDD and the ground VSS, respectively, via a resistance element, a transistor, or the like. This connection manner is not particularly limited.

FIG. 4B shows an internal arrangement of an I/O cell 2 which has only a data input function, where the output control circuit 21 and the two output transistors 23 and 24 are removed from FIG. 2A in which a data input/output function is provided. FIG. 4C shows an arrangement of an I/O cell 2 which has only a data output function, where the input circuit 22 is removed from FIG. 4A.

FIGS. 4D and 4E show variations of the structures of the ground-side protective circuit 6 and the power source-side protective circuit 7. While the ground-side protective circuit 6 and the power source-side protective circuit 7 each include a bipolar transistor in FIG. 4D, the ground-side protective circuit 6 and the power source-side protective circuit 7 each include a diode in FIG. 4E. Note that, in the I/O cells 2 shown in FIGS. 4A, 4C, 4D, and 4E, the H-level output transistor 23 and the L-level output transistor 24 in the I/O circuit 25 also each function as a power source-side protective circuit or a ground-side protective circuit.

(Second Example)

Figure 5:
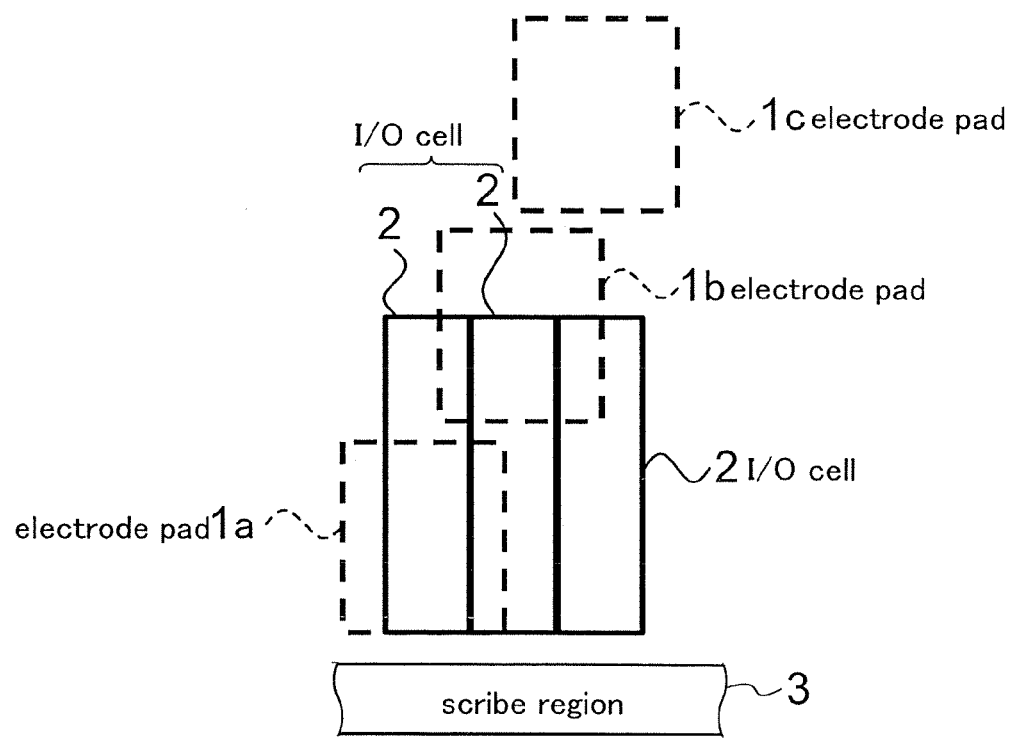
FIG. 5 is a plan view showing a positional relationship between I/O cells, electrode pads for external connection, and a scribe region in a semiconductor integrated circuit device according to a second example of the present invention.

FIG. 5 is a diagram showing an arrangement of a semiconductor integrated circuit device according to a second example of the present invention.

In FIG. 5, electrode pads 1 for I/O cells 2 are arranged in a zigzag pattern as in the first example. In this example, two rows of electrode pads are arranged above the respective corresponding I/O cells 2 and from a side (i.e., a side closer to a scribe region 3) of the semiconductor chip toward the farther inside of the semiconductor chip, and in addition, a row of electrode pads 1c is provided still farther inside the semiconductor chip. The three rows of electrode pads 1a to 1c are arranged in a zigzag pattern. A positional relationship between an end portion closer to the scribe region 3 of the electrode pad 1a and an end portion of the I/O cell 2, and a positional relationship between a power source-side protective circuit 7 and a ground-side protective circuit 6 are similar to those of FIGS. 1 and 3.

Although three rows of electrode pads are used in this example, four or more rows of electrode pads may be arranged in a zigzag pattern.

(Third Example)

Next, a third example of the present invention will be described.

In this example, a length (a distance in a direction from a side to a center portion of a semiconductor chip) of each I/O cell is reduced in order to secure a large empty space below an electrode pad.

Figure 6:
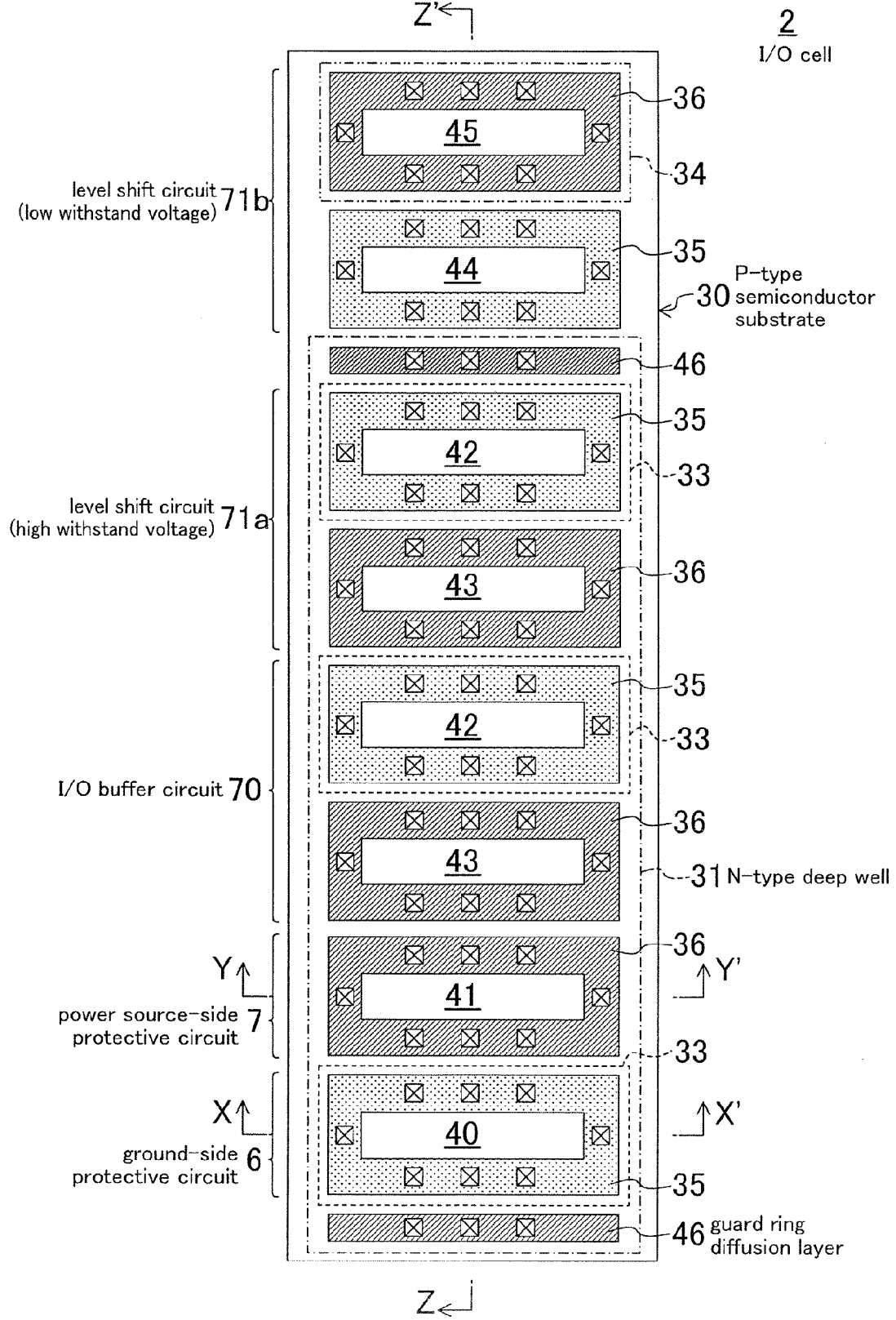
FIG. 6 is a diagram showing an internal layout arrangement of the I/O cell of FIG. 2 in a semiconductor integrated circuit device according to a third example of the present invention.
Figure 7:
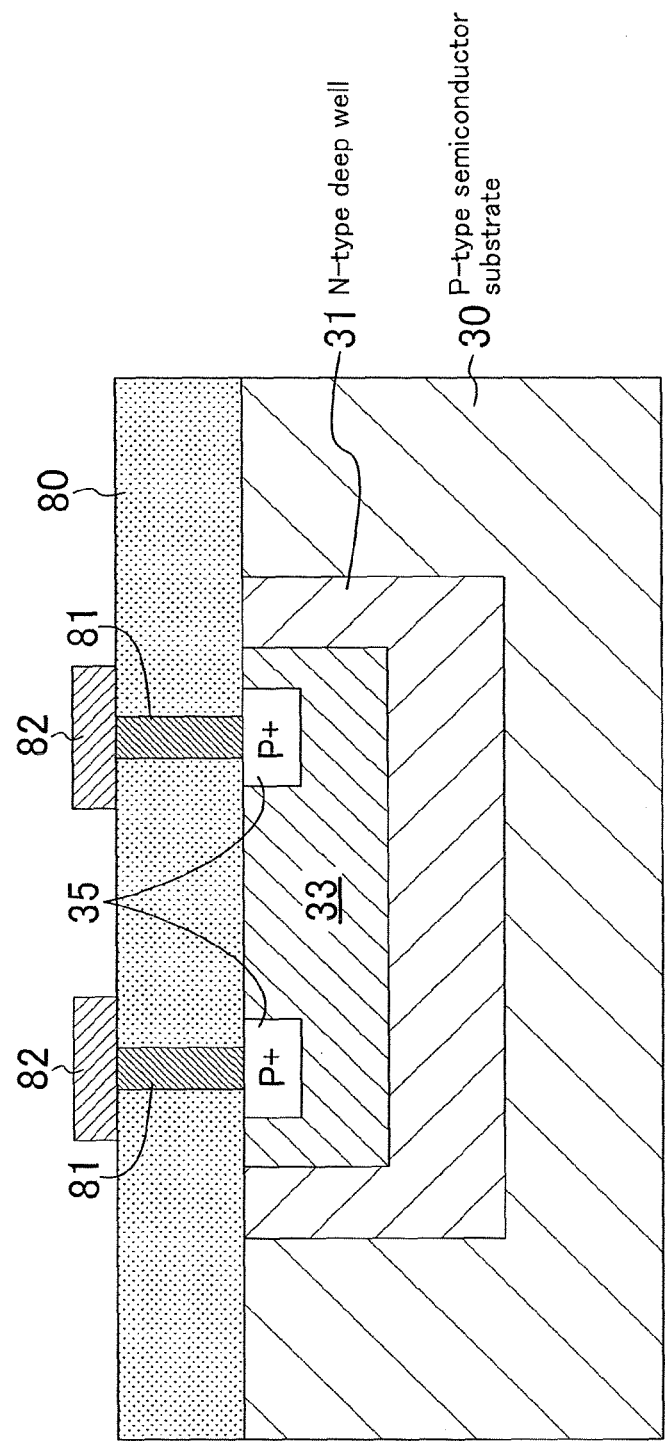
FIG. 7 is a cross-sectional view taken along line X-X' of FIG. 6.
Figure 8:
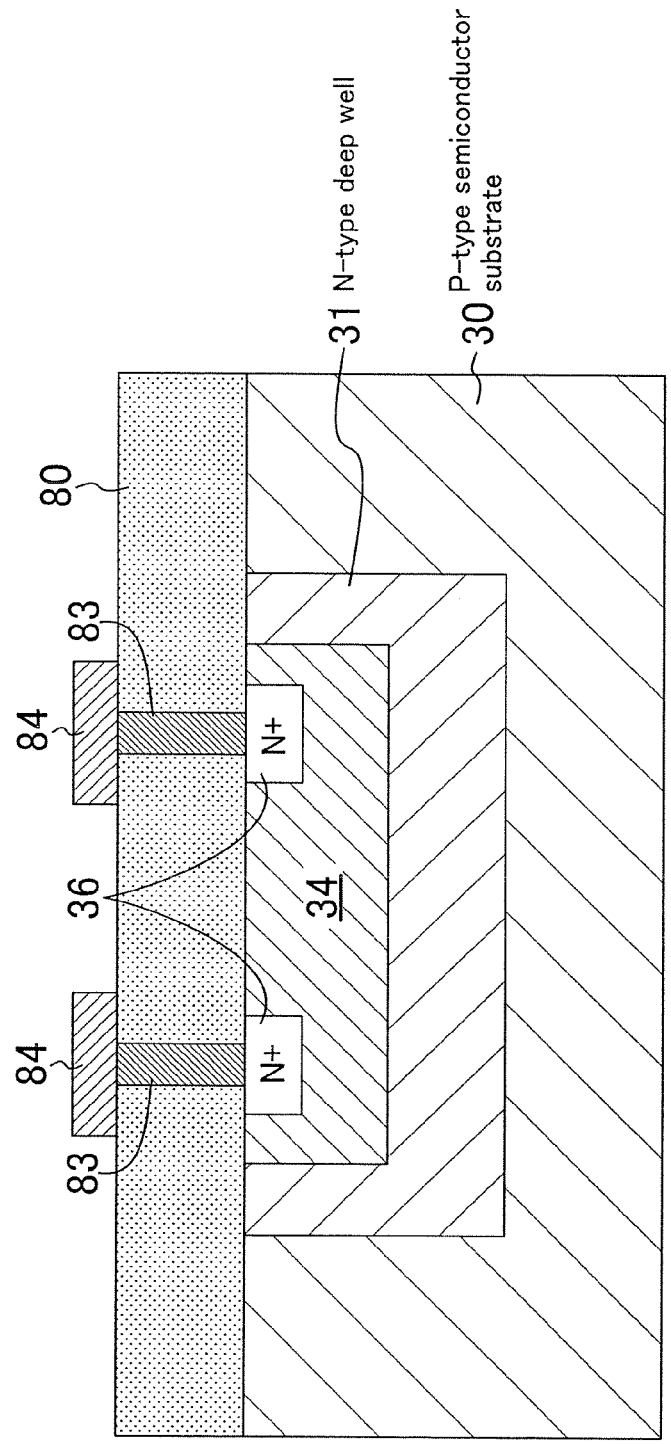
FIG. 8 is a cross-sectional view taken along line Y-Y' of FIG. 6.
Figure 9:
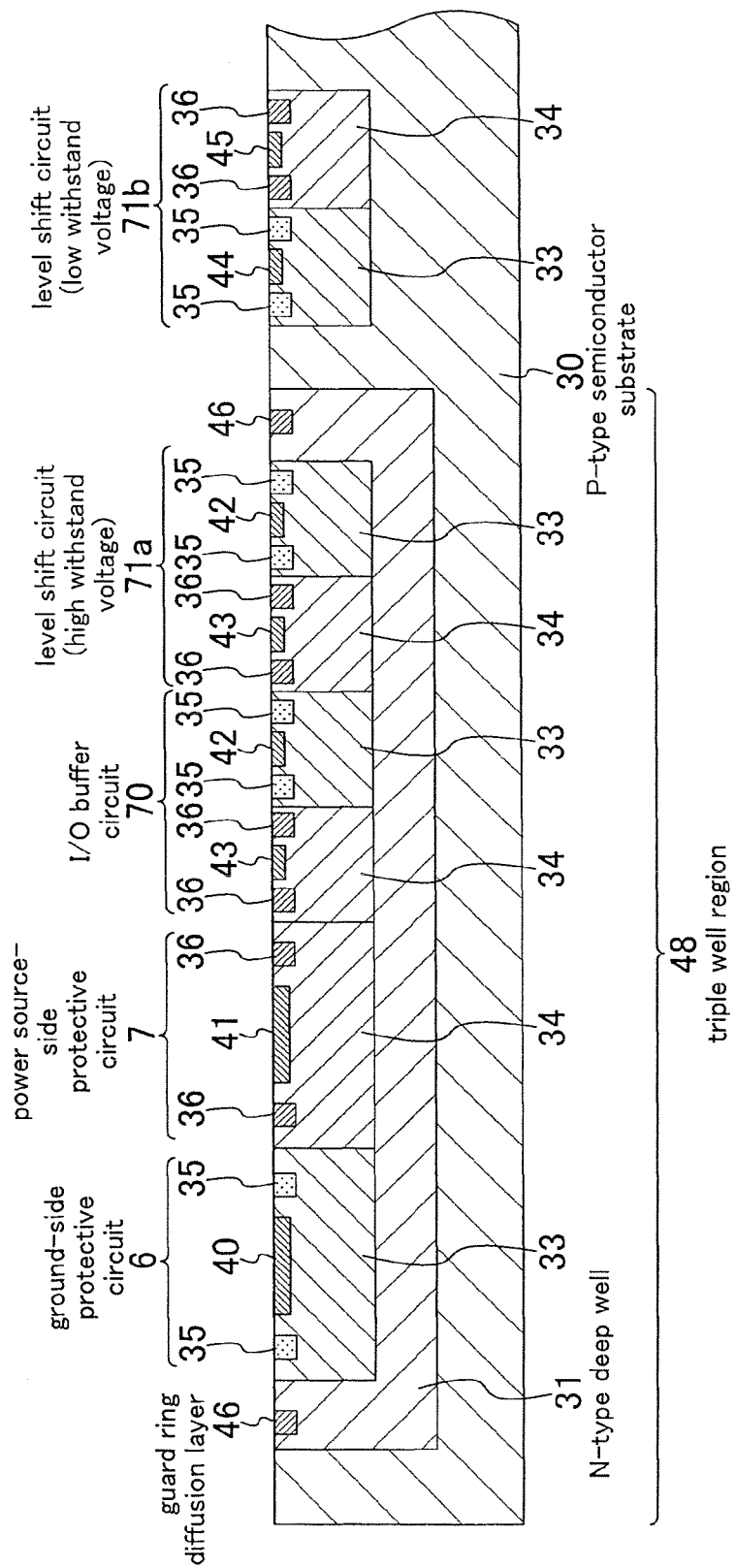
FIG. 9 is a cross-sectional view taken along line Z-Z' of FIG. 6.
Figure 10:
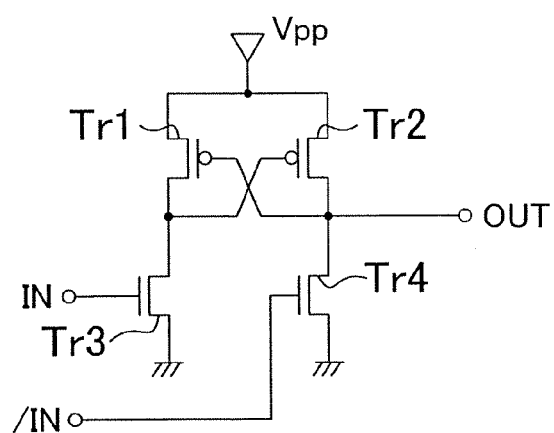
FIG. 10 is a diagram showing an exemplary configuration of an electrical circuit of a level shift circuit included in the I/O circuit.

FIGS. 6 to 9 show internal layout arrangements of the I/O cells 2 of FIG. 2. FIG. 6 is a plan view. FIG. 7 is a cross-sectional view taken along line X-X' of FIG. 6. FIG. 8 is a cross-sectional view taken along line Y-Y' of FIG. 6. FIG. 9 is a cross-sectional view taken along line Z-Z' of FIG. 6. As can be seen from these figures, in the I/O cell 2, a ground-side protective circuit 6 having an N-type diffusion layer region 40 and a power source-side protective circuit 7 having a P-type diffusion layer region 41 are provided in this order from a side of the semiconductor chip. Further, an I/O buffer circuit 70 for inputting and outputting a signal, and a level shift circuit (high withstand voltage side) 71a, and a level shift circuit (low withstand voltage side) 71b are provided in this order above the power source-side protective circuit 7 in FIG. 6 (toward the farther inside of the semiconductor chip). The I/O buffer circuit 70 has a P-type diffusion layer region 43 positioned closer to the side of the semiconductor chip and an N-type diffusion layer region 42 closer to the center of the semiconductor chip. The level shift circuit (high withstand voltage side) 71a also has a P-type diffusion layer region 43 positioned closer to the side of the semiconductor chip and an N-type diffusion layer region 42 closer to the center of the semiconductor chip. The level shift circuit (low withstand voltage side) 71b also has an N-type diffusion layer region 44 closer to the side of the semiconductor chip and a P-type diffusion layer region 45 closer to the center of the semiconductor chip. As can be seen from a diagram shown in FIG. 10, the level shift circuits 71a and 71b are a high withstand voltage-side level shift circuit 71a including, for example, high withstand voltage transistors Tr1 and Tr2 which are operated with a high voltage VPP, and a low withstand voltage-side level shift circuit 71b including, for example, low withstand voltage transistors Tr3 and Tr4 which are operated with a low voltage, respectively.

In the I/O cell 2, the ground-side protective circuit 6, the power source-side protective circuit 7, the I/O buffer circuit 70, and the level shift circuit (high withstand voltage side) 71a are operated with the high voltage VPP, while the level shift circuit (low withstand voltage side) 71b is operated with a low voltage VDD. An internal circuit provided farther inside the semiconductor chip is operated with the low voltage VDD, and a signal from the internal circuit is level-shifted to a signal having the high voltage VPP by the level shift circuit (low withstand voltage side) 71b and the level shift circuit (high withstand voltage side) 71a before being output from the electrode pad 1a or 1b via the I/O buffer circuit 70. The I/O cell 2 has a triple-well structure in order to prevent high voltage noise occurring in the circuits 6, 7, 70, and 71a which are operated with the high voltage VPP from being propagated into the internal circuit located closer to the center of the semiconductor chip. As can be seen from FIGS. 8 and 9, an N-type deep well 31 which electrically separates the circuits 6, 7, 70, and 71a which are operated with the high voltage VPP from a P-type semiconductor substrate 30, so that a triple-well region 48 is formed.

In the circuits 6, 7, 70, 71a, and 71b included in the I/O cell 2, a diffusion region (a guard ring diffusion region 35 or 36) for fixing a well potential which has a conductivity type opposite to the corresponding one of the diffusion regions 40 to 43 is provided, surrounding a periphery of the corresponding one of the diffusion regions 40 to 43. Also, an N-type guard ring diffusion region 46 is provided in each of an end portion closer to the side of the semiconductor chip and an end portion farther inside the semiconductor chip of the N-type deep well 31.

Figure 11:
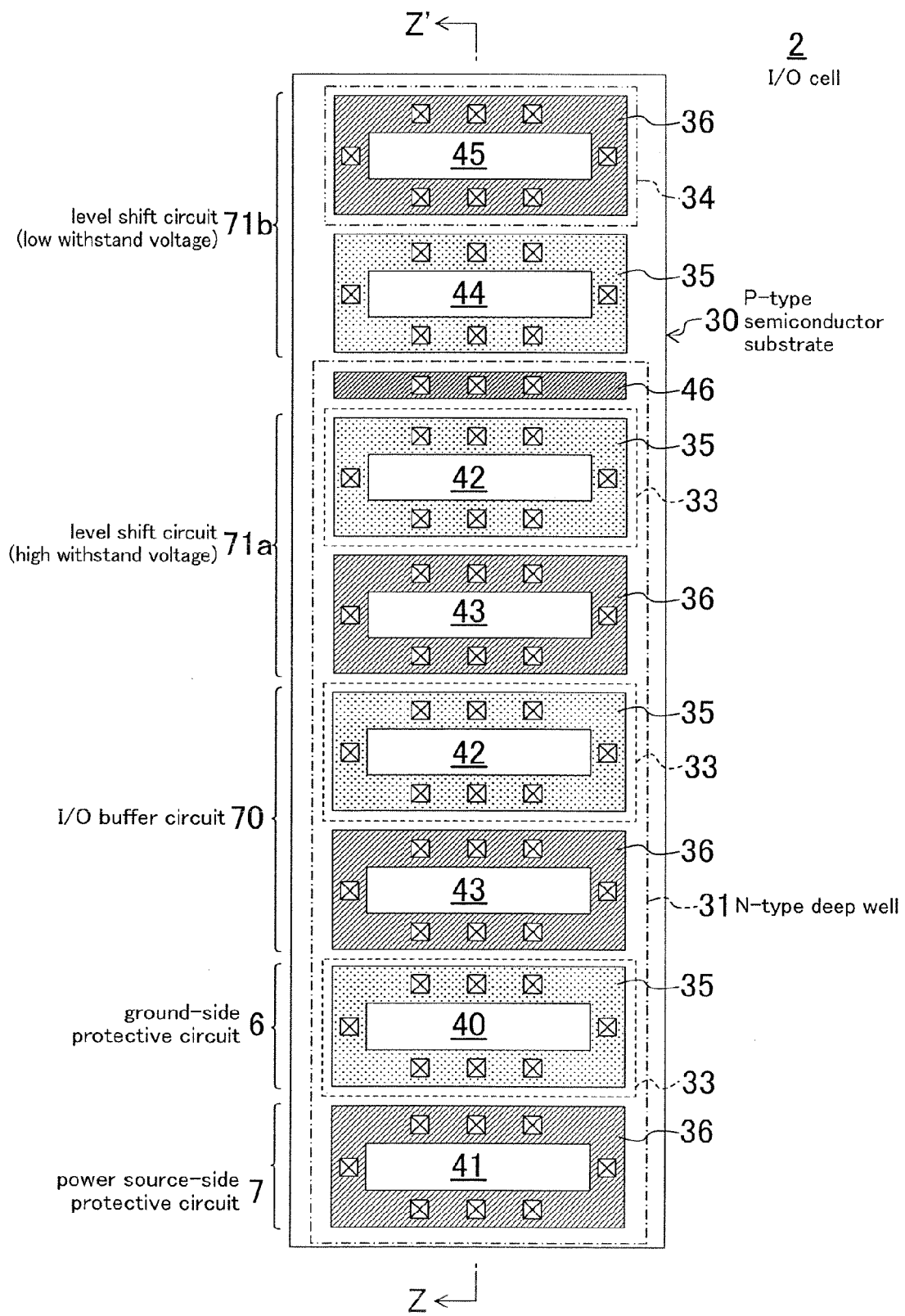
FIG. 11 is a diagram showing an internal layout arrangement of the I/O cell of FIG. 3.
Figure 12:
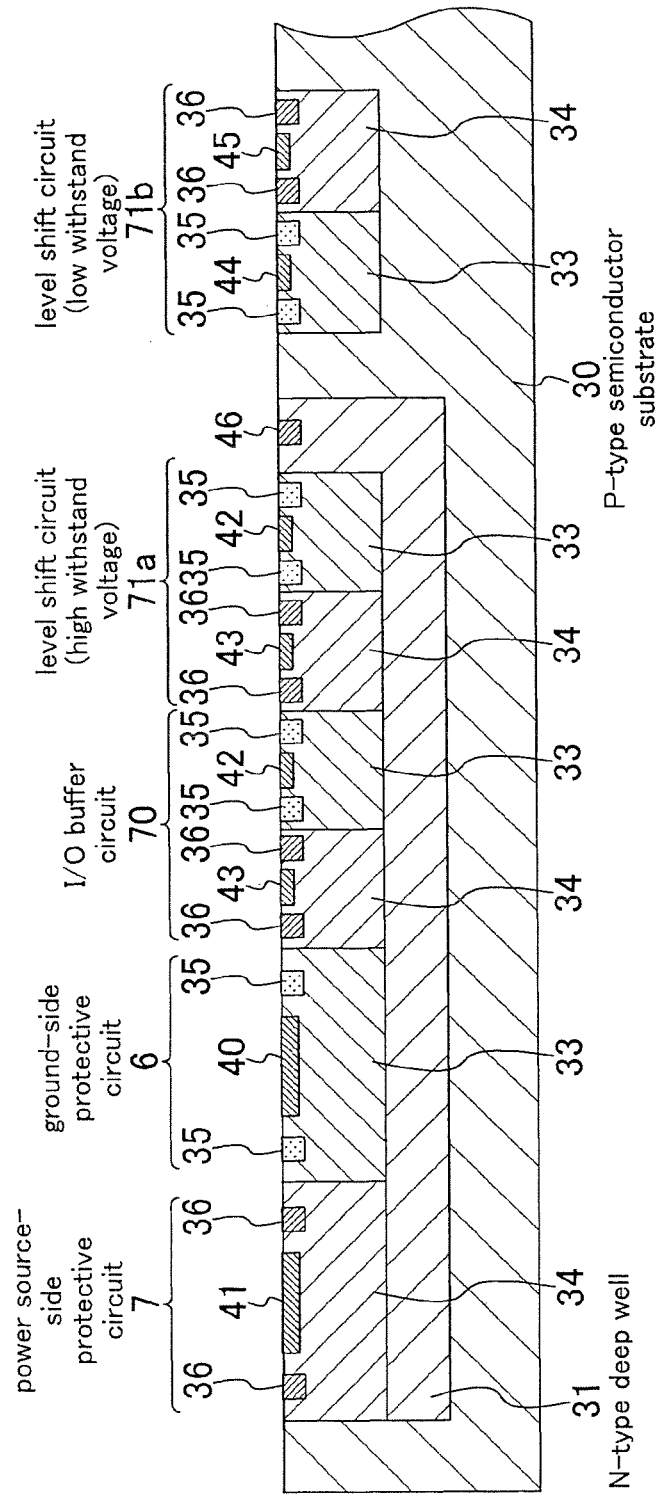
FIG. 12 is a cross-sectional view taken along line Z-Z' of FIG. 11.

On the other hand, FIGS. 11 and 12 show an internal layout arrangement of the I/O cell 2 of FIG. 3. In these figures, in the I/O cell 2, the power source-side protective circuit 7 is provided closer to the side of the semiconductor chip, while the ground-side protective circuit 6 is provided farther inside the semiconductor chip. Therefore, the P-type diffusion region 41 of the power source-side protective circuit 7 and the N-type guard ring diffusion region 36 provided around the P-type diffusion region 41 are positioned closer to the side of the semiconductor chip, so that it is not necessary to provide a dedicated N-type guard ring diffusion region 46 to an end portion closer to the side of the semiconductor chip of the N-type deep well 31, i.e., the N-type guard ring diffusion region 36 for the power source-side protective circuit (predetermined circuit) 7 can be shared by the N-type guard ring diffusion region 46. As a result, a length of the I/O cell 2 can be reduced by an amount corresponding to a region where an N-type guard ring diffusion region 46 dedicated to the N-type deep well 31 would otherwise be provided.

Figure 13:
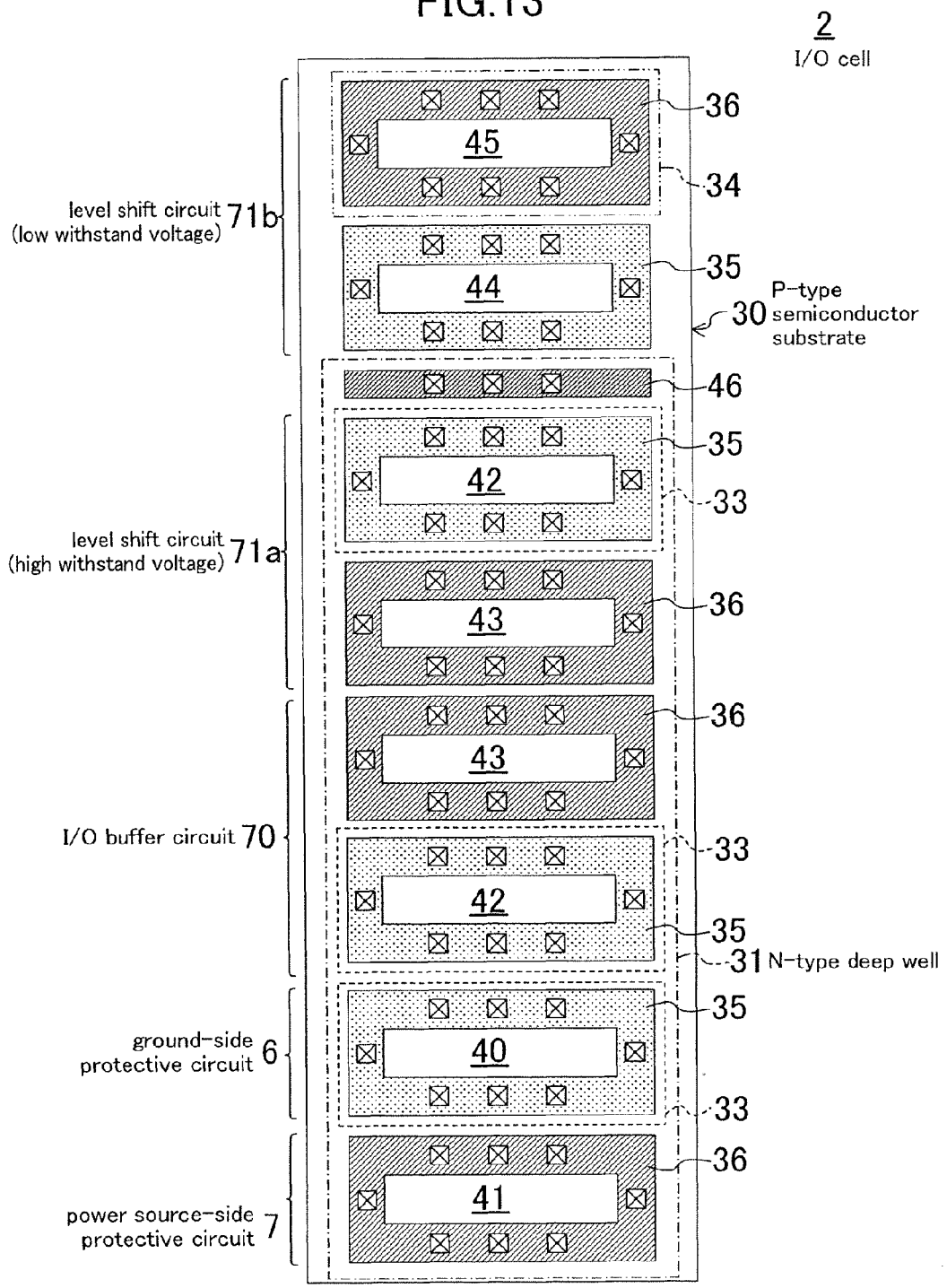
FIG. 13 is a diagram showing a variation of the layout arrangement of the I/O cell of FIG. 11.
Figure 14:
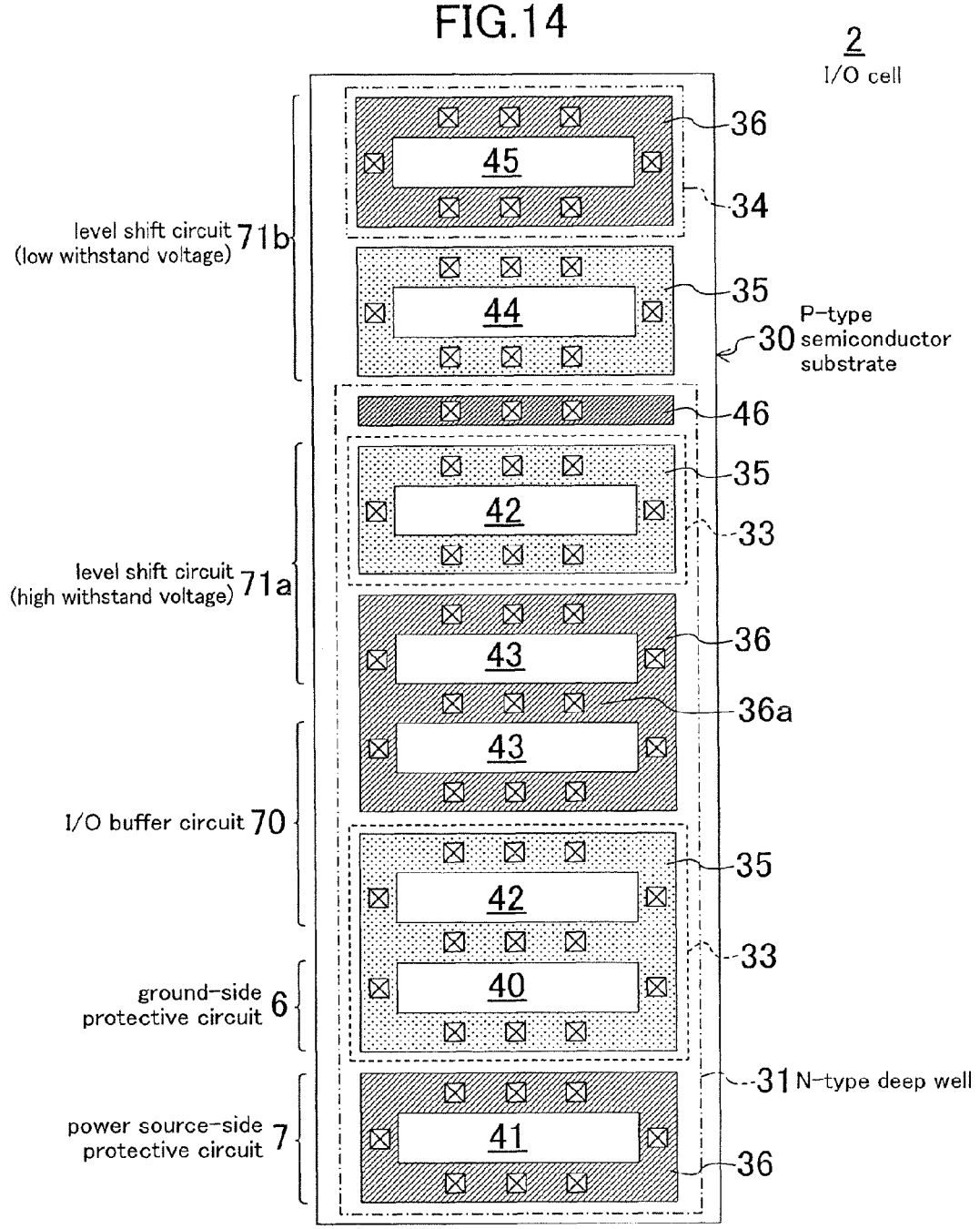
FIG. 14 is a diagram showing a layout arrangement in which the I/O cell of FIG. 13 is modified.
Figure 15:
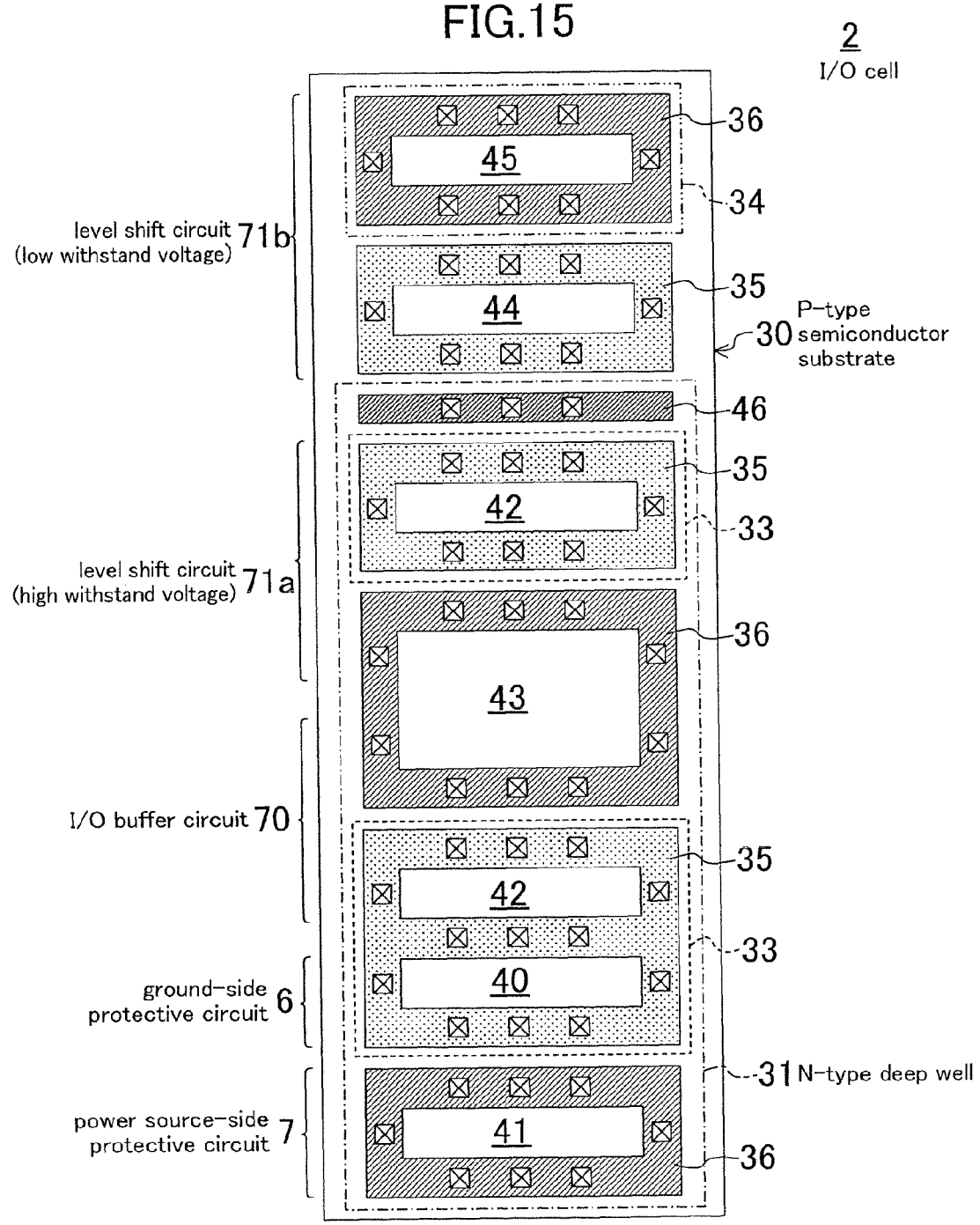
FIG. 15 is a diagram showing a layout arrangement in which the I/O cell of FIG. 14 is further modified.

FIGS. 13 to 15 show variations of this example.

In FIG. 13, in the layout arrangement of the I/O cell 2 of FIG. 11, the positions of the N-type diffusion region 42 and the P-type diffusion region 43 of the I/O buffer circuit 70 are switched. In this layout arrangement, the P-type guard ring diffusion region 35 of the ground-side protective circuit 6 and the P-type guard ring diffusion region 35 of the I/O buffer circuit 70 are adjacent to each other, while the N-type guard ring diffusion region 36 of the I/O buffer circuit 70 and the N-type guard ring diffusion region 36 of the level shift circuit (high withstand voltage side) 71*a* are adjacent to each other. In FIG. 14, further, in the layout arrangement of the I/O cell 2 of FIG. 13, portions facing each other of the two P-type guard ring diffusion regions 35 and 35 of the adjacent ground-side protective circuit 6 and I/O buffer circuit 70 (two predetermined circuits) are replaced with a common region, and portions facing each other of the two N-type guard ring diffusion regions 36 and 36 of the adjacent I/O buffer circuit 70 and level shift circuit (high withstand voltage side) 71*a* (two predetermined circuits) are replaced with a common region. With this arrangement, the length of the I/O cell 2 can be reduced by an amount corresponding to the two common regions.

In FIG. 15, further, in the layout arrangement of FIG. 14, the P-type diffusion region 43 of the I/O buffer circuit 70 and the P-type diffusion region 43 of the level shift circuit (high withstand voltage side) 71*a* are regions in which a circuit is formed, so that N-type guard ring diffusion regions 36*a* facing each other between the P-type diffusion regions 43 and 43 are removed. With this arrangement, the length of the I/O cell 2 can be further reduced.

(Fourth Example)

Figure 16:
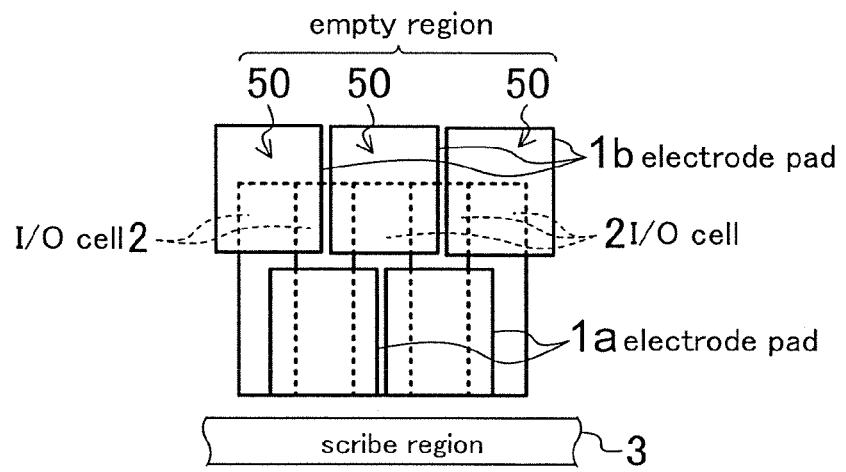
FIG. 16 is a plan view showing a positional relationship between I/O cells, electrode pads for external connection, and a scribe region in a semiconductor integrated circuit device according to a fourth example of the present invention.

FIG. 16 is a diagram showing an arrangement of a semiconductor integrated circuit device according to a fourth example of the present invention.

FIG. 16 shows positions of electrode pads 1 and I/O cells 2 connected thereto. In FIG. 16, the electrode pads 1*a* and 1*b* are arranged in a zigzag pattern as viewed from a scribe region 3. An end portion closer to the scribe region 3 of the electrode pad 1*a* closer to the scribe region 3 is set at substantially the same position as that of an end portion closer to the scribe region 3 of the I/O cell 2. Therefore, a portion (an end portion closer to the electrode pad 1*a*) of the electrode pad (specific electrode pad) 1*b* farther from the scribe region 3 is positioned above the I/O cell 2, while the remaining portion thereof is positioned farther inside the semiconductor chip than the I/O cell 2. As a result, an empty space 50 which does not overlap the I/O cell 2 is present below an end portion farther inside the semiconductor chip of the electrode pad 1*b*. In this example, the empty space 50 is effectively utilized.

Figure 17:
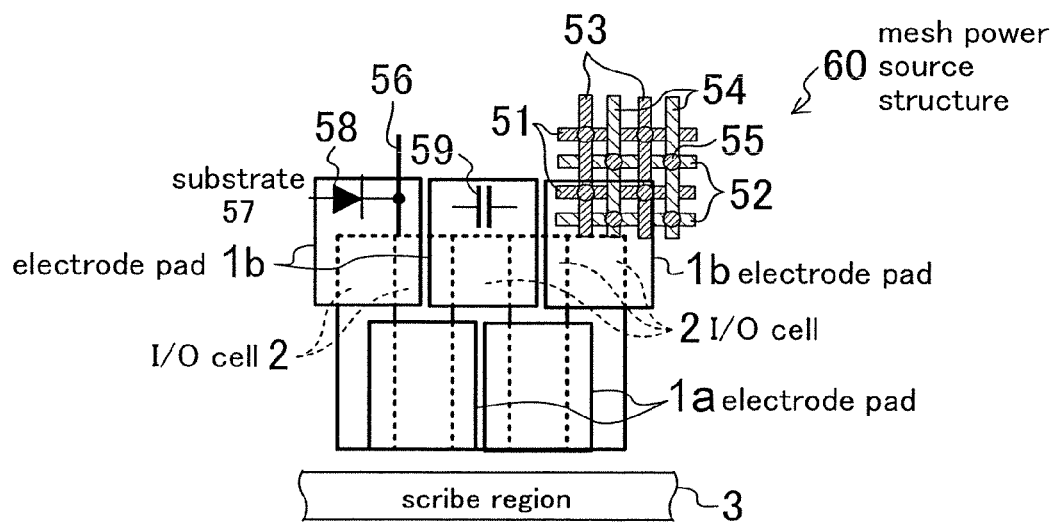
FIG. 17 is a plan view showing an exemplary arrangement of a mesh power source structure or circuit elements different from I/O cells in an empty space below an electrode pad positioned inside the semiconductor integrated circuit device of FIG. 16.
Figure 18:
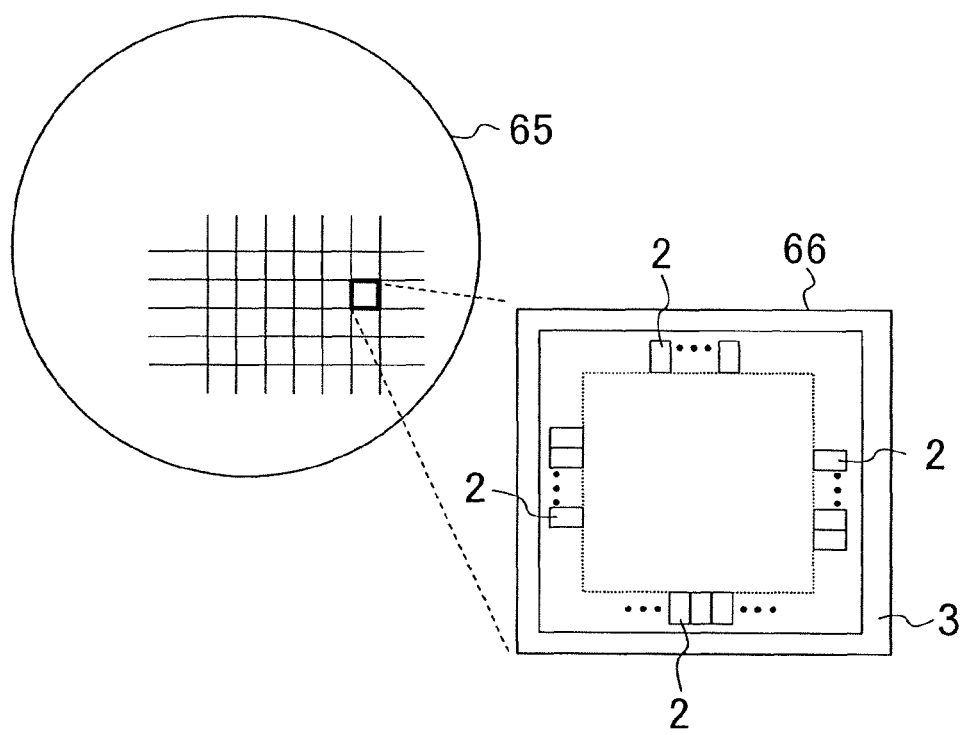
FIG. 18 is a plan view showing a semiconductor wafer and a number of semiconductor chips inside the wafer during manufacture of the semiconductor chips.

FIG. 17 shows an example in which a power source wiring or a circuit element different from the I/O cell 2 is provided in the empty space 50. A description will be hereinafter given.

When a power source wiring is provided in the empty space 50, the power source wiring is made of a wiring layer provided below a wiring layer which is used for the electrode pads 1*a* and 1*b*. The power source wiring may be a linear wiring, or alternatively, may be a mesh-like power source wiring. In the case of the mesh-like power source wiring, if the electrode pads 1*a* and 1*b* are made of an $n^{th}$-wiring layer, a plurality of power source wirings 51 and a plurality of ground wirings 52 which are made of an $(n-1)^{th}$-wiring layer are alternately provided in parallel with the scribe region 3, while a plurality of power source wirings 53 and a plurality of ground wirings 54 which are made of an $(n-2)^{th}$-wiring layer are alternately provided in perpendicular to the scribe region 3. In addition, the $(n-1)^{th}$ layer and the $(n-2)^{th}$ layer are connected to each other through a via 55 at the same node, thereby constructing a so-called mesh-like power source structure 60.

Note that the mesh-like power source structure 60 can be constructed using a combination of a power source wiring and a ground wiring selected from a first power source wiring and a first ground wiring, and a second power source wiring and a second ground wiring other than the first power source wiring and the first ground wiring, where the first power source wiring and the first ground wiring represent a power source wiring and a ground wiring connected to the power source wiring 4 and the ground wiring 5 used in the I/O cell 2 (see FIG. 3).

Alternatively, as shown in FIG. 17, when a circuit element different from the I/O cell 2 is provided in the empty space 50, a circuit or an element which provides a function required in the semiconductor chip is provided. Examples of such a circuit or element include a logic circuit element, a memory circuit element, and the like. Alternatively, a protective circuit may be provided which provides protection from discharge of static electricity between a power source wiring and a power source wiring, a power source wiring and a ground wiring, or a ground wiring and a ground wiring which are a combination of two kinds of wirings selected from the second power source wiring and the second ground wiring, and a third power source wiring and a third ground wiring other than the second power source wiring and the second ground wiring. Further, as the circuit element different from the I/O cell 2, a diode 58 for preventing charge up of a signal wiring 56 may be inserted between the signal wiring 56 and a semiconductor substrate 57, or an inter-power source capacitance element 59 may be provided between the plurality of power source wirings and the plurality of ground wirings, as shown in FIG. 17.

Although it has been assumed in this example that two rows of electrode pads are provided, three or more rows of electrode pads may be used. In this case, when end portions farther inside the semiconductor chip of the third and more electrode pads are positioned farther inside the semiconductor chip than the I/O cell 2, this example may be applied to an empty space in which the I/O cell 2 is not positioned of a region below the third and more electrode pads.

What is claimed is:

1. A semiconductor integrated circuit device, comprising:
   a semiconductor chip including an internal circuit and a plurality of I/O cells, wherein:
   the plurality of I/O cells are provided on a periphery area of the semiconductor chip,
   each of the plurality of I/O cells includes a protective circuit for protecting the internal circuit from discharge of static electricity,
   each of the plurality of I/O cells has a corresponding electrode pad connected to the corresponding protective circuit,
   electrode pads for the plurality of I/O cells are arranged on a first line, a second line and a third line, the first line being disposed closer to the outermost edge of the semiconductor chip than the second line, and the second line being disposed closer to the outermost edge of the semiconductor chip than the third line, and
   side edges of the electrode pads disposed on the first line, which are parallel to and closest to the outermost edge of the semiconductor chip, are disposed on a substantially same line as side edges of the plurality of I/O cells, which are parallel to and closest to the outermost edge of the semiconductor chip.

2. The semiconductor integrated circuit device of claim 1, wherein the side edges of the electrode pads disposed on the first line, which are parallel to and closest to the outermost edge of the semiconductor chip, are disposed on a same line as the side edges of the plurality of I/O cells, which are parallel to and closest to the outermost edge of the semiconductor circuit.

3. The semiconductor integrated circuit device of claim 1, wherein the electrode pads for the plurality of I/O cells are arranged in a zigzag pattern between the first line, the second line and the third line.

4. The semiconductor integrated circuit device of claim 1, wherein each of the electrode pads arranged at least on the first line and the second line overlaps corresponding one of the plurality of I/O cells in plane view.

5. The semiconductor integrated circuit device of claim 1, wherein:
the protective circuit of each of the plurality of I/O cells includes:
a power source-side protective circuit provided between the corresponding electrode pad and a power source wiring; and
a ground-side protective circuit provided between the corresponding electrode pad and a ground wiring, and
the power source-side protective circuit is positioned closer to the outermost edge of the semiconductor chip than the ground-side protective circuit.

6. The semiconductor integrated circuit device of claim 5, wherein the power source wiring is positioned closer to the outermost edge of the semiconductor chip than the ground wiring.

7. The semiconductor integrated circuit device of claim 6, wherein the power source wiring overlaps the power source-side protective circuit in plane view, while the ground wiring overlaps the ground-side protective circuit in plane view.

8. The semiconductor integrated circuit device of claim 5, wherein a distance between a center position of the ground-side protective circuit and a center position of the electrode pad connected to the ground-side protective circuit is the same between adjacent two of the I/O cells.

9. The semiconductor integrated circuit device of claim 5, wherein the side edges of the electrode pads disposed on the first line, which are parallel to and closest to the outermost edge of the semiconductor chip, are disposed on a same line as the side edges of the plurality of I/O cells, which are parallel to and closest to the outermost edge of the semiconductor circuit.

10. The semiconductor integrated circuit device of claim 5, wherein the electrode pads for the plurality of I/O cells are arranged in a zigzag pattern between the first line, the second line and the third line.

11. The semiconductor integrated circuit device of claim 1, wherein:
the protective circuit of each of the plurality of I/O cells includes:
a power source-side protective circuit provided between the corresponding electrode pad and a power source wiring; and
a ground-side protective circuit provided between the corresponding electrode pad and a ground wiring, and
the ground-side protective circuit is positioned closer to the outermost edge of the semiconductor chip than the power source-side protective circuit.

12. The semiconductor integrated circuit device of claim 11, wherein the side edges of the electrode pads disposed on the first line, which are parallel to and closest to the outermost edge of the semiconductor chip, are disposed on a same line as the side edges of the plurality of I/O cells, which are parallel to and closest to the outermost edge of the semiconductor circuit.

13. The semiconductor integrated circuit device of claim 11, wherein the electrode pads for the plurality of I/O cells are arranged in a zigzag pattern between the first line, the second line and the third line.

14. The semiconductor integrated circuit device of claim 11, wherein the ground wiring is positioned closer to the outermost edge of the semiconductor chip than the power source wiring.

15. The semiconductor integrated circuit device of claim 14, wherein the power source wiring overlaps the power source-side protective circuit in plane view, while the ground wiring overlaps the ground-side protective circuit in plane view.

16. The semiconductor integrated circuit device of claim 11, wherein a distance between a center position of the power source-side protective circuit and a center position of the electrode pad connected to the power source-side protective circuit is the same between adjacent two of the I/O cells.

* * * * *